United States Patent
de Oliveira et al.

(10) Patent No.: US 10,261,156 B2
(45) Date of Patent: Apr. 16, 2019

(54) METHOD AND MAGNETIC RESONANCE APPARATUS FOR DETERMINING DIFFUSION-WEIGHTED IMAGE DATA

(71) Applicant: Siemens Healthcare GmbH, Erlangen (DE)

(72) Inventors: Andre de Oliveira, Uttenreuth (DE); David Grodzki, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 86 days.

(21) Appl. No.: 15/651,332

(22) Filed: Jul. 17, 2017

(65) Prior Publication Data

US 2018/0017650 A1    Jan. 18, 2018

(30) Foreign Application Priority Data

Jul. 18, 2016    (DE) .................. 10 2016 213 062

(51) Int. Cl.
  *G01R 33/563*    (2006.01)
  *G01R 33/48*    (2006.01)
  *G01R 33/56*    (2006.01)

(52) U.S. Cl.
  CPC ... *G01R 33/56341* (2013.01); *G01R 33/4818* (2013.01); *G01R 33/56* (2013.01); *G01R 33/482* (2013.01)

(58) Field of Classification Search
  CPC .......... G01R 33/56341; G01R 33/4818; G01R 33/53; G01R 33/482
  See application file for complete search history.

(56) References Cited

U.S. PATENT DOCUMENTS

| | | | |
|---|---|---|---|
| 2008/0242972 A1 | 10/2008 | Jung et al. | |
| 2009/0267603 A1* | 10/2009 | Yanasak | G01R 33/56341 324/309 |
| 2011/0241679 A1* | 10/2011 | Feiweier | G01R 33/56341 324/309 |
| 2013/0021805 A1 | 1/2013 | Veerasamy et al. | |
| 2013/0033262 A1 | 2/2013 | Porter | |

(Continued)

FOREIGN PATENT DOCUMENTS

CA    2 854 844 A1    12/2015

OTHER PUBLICATIONS

Cheng et al: "Joint 6D k-q Space Compressed Sensing for Accelerated High Angular Resolution Diffusion MRI"; Information Processing in Medical Imaging; 24th International Conference; IPMI 2015; pp. 782-793; (2015).

(Continued)

*Primary Examiner* — Gregory H Curran
(74) *Attorney, Agent, or Firm* — Schiff Hardin LLP

(57) ABSTRACT

In a method and magnetic resonance (MR) apparatus for determining diffusion-weighted image data, first raw data are acquired with a first diffusion weighting, and the first raw data are assigned to a first k-space matrix. Second raw data are acquired with a second diffusion weighting, and the second raw data are assigned to a second k-space matrix. The first k-space matrix and the second k-space matrix are different from one another at at least one position. The diffusion-weighted image data are determined in a processor based on the first raw data and the second raw data.

11 Claims, 5 Drawing Sheets

(56) References Cited

U.S. PATENT DOCUMENTS

2016/0202338 A1* 7/2016 Kimura .............. G01R 33/5608
324/309

OTHER PUBLICATIONS

Heidemann et al: "Diffusion Imaging in Humans at 7T Using Readout-Segmented EPI and GRAPPA"; Magnetic Resonance in Medicine vol. 64; pp: 9-14; (2010).

Porter, et al.: "High Resolution Diffusion-Weighted Imaging Using Readout-Segmented Echo-Planar Imaging, Parallel Imaging and a Two-Dimensional Navigator-Based Reacquisition"; Magnetic Resonance in Medicine; vol. 62; pp. 468-475 ; (2009).

* cited by examiner

◯ first k-space matrix 41   ◯ second k-space matrix 42

METHOD AND MAGNETIC RESONANCE APPARATUS FOR DETERMINING DIFFUSION-WEIGHTED IMAGE DATA

BACKGROUND OF THE INVENTION

Field of the Invention

The invention concerns a method, a magnetic resonance apparatus and a non-transitory, computer-readable data storage medium for determining diffusion-weighted image data.

Description of the Prior Art

In a magnetic resonance apparatus, the examination subject to be scanned, a patient for example, is typically exposed to a strong basic magnetic field, of 1.5 or 3 tesla for example, by the operation of a basic field magnet. In addition, a magnetic field gradient is applied by a gradient coil arrangement. Radio-frequency, excitation signals (RF signals) are then transmitted by suitable antennas in order to tip the nuclear spins of specific atoms excited into resonance by the radio-frequency field through a defined flip angle with respect to the magnetic field lines of the basic magnetic field. Due to the resulting precession of the nuclear spins, radio-frequency signals, known as magnetic resonance signals (MR signals), are emitted, and are received by suitable reception antennas, and then processed further. To perform a specific measurement, it is necessary to transmit a specific MR sequence, known as a pulse sequence, which is composed of a series of radio-frequency pulses, in particular excitation pulses and refocusing pulses, as well as matched gradient pulses that are activated in a coordinated manner. Readout windows, matching with respect to time to the pulses, must be set, which specify the time periods in which the induced MR signals are captured. A critical factor for the imaging in this case is the timing within the sequence, i.e. which pulses succeed one another at which time intervals.

The data domain in which the MR signals are entered is referred to as k-space. The MR signals are digitized and stored as complex numerical values in a k-space matrix, which is a subregion of k-space. All of the complex numerical values of the k-space matrix are referred to as raw data. Associated image data can be reconstructed from the raw data by a multidimensional Fourier transformation, for example.

The way that the k-space matrix is filled with complex numerical values has an influence on the reconstructed image data. To provide a correct replication of the anatomy of the examination subject, the k-space matrix typically satisfies the Nyquist criterion. In addition, the k-space matrix determines the resolution of the image data, namely the size of the pixels of the image data. In order to increase the resolution of the image data, the size of the k-space matrix must be increased. The greater the resolution of the image data, the smaller is the size of the pixels of the image data. The complex numerical values of the center of k-space determine the contrast of the image data. The k-space matrix is typically filled in the center of k-space.

In diffusion-weighted magnetic resonance imaging (diffusion imaging), the diffusion movement of specific substances in the body tissue can be measured and represented in spatially resolved form. Diffusion imaging has become established as part of day-to-day clinical routine, particularly in relation to neurological issues. In addition, diffusion imaging is used to an increasing extent in the field of ontological, cardiological and musculoskeletal disorders.

In order to generate diffusion-weighted image data, it is first necessary to acquire diffusion-encoded raw data. This is achieved by special MR sequences, referred to in the following as diffusion sequences. A characterizing feature of diffusion sequences is that, in addition to the magnetic field gradients for spatial encoding, magnetic field gradients known as diffusion gradients are activated for spatially dependent dephasing and rephasing of the nuclear spins. At a position in space, the dephasing and the rephasing are typically equal in strength, resulting in a neutralization of the dephasing by the rephasing. If a diffusion movement of the nuclear spins is present, the nuclear spins may be subjected to dephasing and rephasing of different strengths, leading, when considered overall, to a dephasing, as a result of which the MR signals may be modified by the extent of the dephasing. MR signals acquired in this way are referred to as diffusion-encoded raw data. The associated image data are referred to as diffusion-encoded image data.

In diffusion imaging, a number of diffusion-encoded image data sets are generally acquired using different diffusion weightings, i.e. using different diffusion gradients, and are combined with one another. The strength of the diffusion weighting is in most cases defined by a factor called the diffusion weighting factor, also referred to as the "b-value". The different diffusion-encoded image data or the diffusion-weighted image data to be combined therefrom can then be used for the desired diagnostic purposes.

A typical example of diffusion-weighted image data are images or parameter maps, in which a free diffusion process having an apparent diffusion coefficient (ADC) is assumed. This process is characterized by a decrease in the signal strength according to an exponential relation as a function of the diffusion weighting factor. The diffusion-weighted image data is accordingly specified preferably as ADC maps.

SUMMARY OF THE INVENTION

An object of the invention is to provide a method for determining diffusion-weighted image data by operation of a magnetic resonance apparatus, wherein particularly high diffusion gradients can be taken into account.

The inventive method for determining diffusion-weighted image data by operation of a magnetic resonance apparatus has the following steps. First raw data are acquired with a first diffusion weighting, and the first raw data are assigned to a first k-space matrix. Second raw data are acquired with a second diffusion weighting, and the second raw data are assigned to a second k-space matrix. The first k-space matrix and the second k-space matrix are different from one another at at least one position. The diffusion-weighted image data are determined based on the first raw data and the second raw data.

Raw data are typically generated by the execution of an MR sequence in an MR data acquisition scanner. In order to acquire the first raw data, a first MR sequence is preferably applied that has a diffusion encoding module. The diffusion encoding module preferably has two first diffusion gradients in one spatial direction. The diffusion encoding module may have further diffusion gradients in further spatial directions. For the acquisition of the first raw data, the diffusion encoding module typically generates a first diffusion weighting, which typically is characterized by the first diffusion gradient and/or its induced first b-value. The first raw data are assigned to the first k-space matrix. The set of all positions assigned to first raw data acquired with the first diffusion weighting typically corresponds to the first k-space matrix.

The second diffusion weighting is preferably different from the first diffusion weighting. The first diffusion weighting or the second diffusion weighting can be used as a reference. The diffusion weighting, in particular that which can be used as a reference, can have a diffusion gradient of zero, in particular a b-value of zero.

The first k-space matrix is typically a subregion of k-space. The k-space typically has an arbitrary number of points. The first k-space matrix is typically delimited in all dimensions of k-space and preferably encompasses the center of k-space. The first k-space matrix typically has defined distances between the individual entries of the k-space matrix. The embodiment of the MR sequence that is to be applied typically defines the first k-space matrix. In particular, a first readout module of the MR sequence determines the order and the number of the raw data that are to be acquired, and consequently the first k-space matrix. This applies analogously to the second k-space matrix, the latter being determined by a second readout module.

The first MR sequence can be designed in such a way that when it is applied, the first raw data are acquired with the first diffusion weighting, and the second raw data with the second diffusion weighting. The acquisition of the second raw data with the second diffusion weighting can be accomplished by the application of a second MR sequence. The acquisition of the second raw data differs from the acquisition of the first raw data preferably in terms of the diffusion encoding module used therefor and/or in terms of the b-value generated by the diffusion encoding module. Furthermore, the second readout module is preferably modified in such a way that a second k-space matrix is filled with raw data.

The first k-space matrix and the second k-space matrix are different from one another at at least one position. The positions of k-space to which the first raw data and the second raw data are assigned differ accordingly. Furthermore, the first raw data is typically different from the second raw data, i.e. the complex numeric values in each case, also at a position at which the first k-space matrix and the second k-space matrix are not empty. The first k-space matrix consequently specifies a first value range of k-space for the first raw data. The first raw data corresponds to the numeric values that are to be assigned to the first value range. The second k-space matrix specifies a second value range of k-space for the second raw data. The second raw data corresponds to the numeric values that are to be assigned to the second value range.

The first raw data and the second raw data are used for determining the diffusion-weighted image data. Raw data is present in k-space. Diffusion-weighted image data is preferably determined in such a way that it is present in the image space. A Fourier transform, in particular a reconstruction of the first and/or of the second raw data, can be performed for this purpose. Algorithms can perform a combination and/or modulation of the first raw data and/or of the second raw data in k-space. Algorithms can perform a combination and/or modulation of the Fourier-transformed first raw data and/or of the Fourier-transformed second raw data in the image space. The difference between the first k-space matrix and the second k-space matrix is preferably taken into account in the determination of the diffusion-weighted image data. When the diffusion-weighted image data is determined, the difference between the first k-space matrix and the second k-space matrix is preferably compensated for in such a way that the diffusion-weighted image data corresponds as precisely as possible to that diffusion-weighted image data that could be generated if first k-space matrix and second k-space matrix are in agreement, in particular if the first k-space matrix and the second k-space matrix correspond to the larger of the two k-space matrices in the method according to the invention. The diffusion-weighted image data may be present in k-space. The diffusion-weighted image data may be present in the image space. The diffusion-weighted image data can be displayed to a user of the magnetic resonance device.

The diffusion-weighted image data may for example be ADC maps that are generated based on image data having the first diffusion weighting and image data having the second diffusion weighting. An interpolation of the diffusion weighting may be advantageous for this purpose. Thus, the following relation typically applies to a pixel of the image data:

$$I(b)=I_0\exp(-ADC\cdot b) \quad (1)$$

ADC corresponds in this case to the value of the ADC map for the pixel, $I_0$ to the signal intensity of the reference image data acquired with a b-value of zero, b to the b-value, and I(b) to the signal intensity of the image data acquired with the b-value b. The signal intensity of the image data can therefore be determined for different b-values with the aid of the ADC map. A number of image data sets acquired with different b-values are preferably available for determining the b map. This relation applies in particular to smaller b-values. Based on equation 1, the signal intensity of image data with b-values that have increased in comparison with the b-values of the image data used for generating the ADC map can be determined only imprecisely. A cause of this may be, for example, noise that increases with the b-values in the image data.

A strong diffusion weighting typically corresponds to a large magnetic moment, a gradient moment, of the diffusion gradient. The gradient moment is in particular proportional to the time integral of the gradient amplitude. Limitations in the design of the magnetic resonance device, in particular of the gradient coils, typically limit the gradient amplitude and/or the magnetic moment that can be generated in a specific time period. In order to be able to take high b-values into account in the determination of the ADC map (cf. equation 1), acquisitions with a correspondingly strong diffusion weighting, i.e. with a correspondingly high b-value, are necessary.

Due to the activation of the diffusion gradients, the period of time that elapses between the generation of the MR signals and the capture of the MR signals by a receive antenna is typically longer in diffusion imaging in comparison with MR sequences without diffusion gradients. The MR signals to be captured typically become weaker with time, for which reason the activation of the diffusion gradients should last for as short a time as possible. In order to achieve a desired b-value, the amplitude and/or rate of rise must typically be increased in the case of a shortened diffusion gradient. In most cases the highest demands on the magnetic resonance device are imposed by the amplitude and/or the rate of rise that are/is used for diffusion gradients.

An advantage of the method according to the invention is the ability to choose a k-space matrix as a function of the diffusion weighting for the raw data that are to be acquired. In particular, the volume of the raw data that is to be acquired can be determined as a function of the diffusion weighting. Thus, for example, less raw data can be acquired when a stronger diffusion weighting is used. As a result, the echo time of the MR sequence can for example be chosen consistently for different b-values.

According to the inventive method, the period of time taken for generating the diffusion weighting can be adjusted. This enables, for example, the first diffusion weighting and the second diffusion weighting to be generated with the same amplitude of the diffusion gradient. The k-space matrices that are to be filled with the first raw data and with the second raw data can be adjusted in such a way that the period of time that elapses between RF pulses remains constant, for example.

The inventive method for determining diffusion-weighted image data accordingly has the flexibility to take into account data acquired using diffusion weightings of different strengths. In particular, restrictions of the gradient coils during the application of diffusion gradients, in particular at high b-values, can be avoided. According to the inventive method, particularly high diffusion gradients can be used for determining the diffusion-weighted image data. The method according to the invention enables raw data to be measured using a particularly high diffusion weighting, such that the image data to be reconstructed therefrom does not require to be calculated, i.e. extrapolated, with the use of equation (1). The diffusion-weighted image data determined therefrom is accordingly particularly accurate for high b-values.

According to a notional assumption, a congruence of the first k-space matrix with the second k-space matrix may be present during a determination of diffusion-weighted image data. According to the notional assumption, a diffusion sequence having a set echo time, having a set readout module and having a set diffusion weighting can generate raw data. A b-value and/or a diffusion weighting can be described as high if, according to the notional assumption, while fully utilizing the specification of a gradient coil that is used for applying the diffusion gradient, a diffusion sequence having a set echo time and having a set readout module is unable to generate any raw data. An echo time can be described as short if, according to the notional assumption, while fully utilizing the specification of a gradient coil that is used for applying the diffusion gradient, a diffusion sequence having a set b-value and having a set readout module is unable to generate any raw data. A resolution can be described as high if the resolution requires such a readout module that, according to the notional assumption, while fully utilizing the specification of a gradient coil that is used for applying the diffusion gradient, a diffusion sequence having a set echo time and having a set b-value is unable to generate any raw data without extending the duration of the measurement.

In an advantageous embodiment variant of the method, the second diffusion weighting is stronger than the first diffusion weighting. Accordingly, the second diffusion gradient preferably generates a stronger gradient moment, a greater b-value and consequently a stronger dephasing than the first diffusion gradient. Accordingly, the first raw data are preferably subject to a diffusion weighting that is different from the diffusion weighting of the second raw data. The second diffusion gradient can have a greater amplitude than the first diffusion gradient and/or a shorter duration and/or a greater rate of rise. The first diffusion gradient can be equal to zero, such that the first raw data corresponds to reference data without diffusion weighting. Further raw data can be acquired using at least one further diffusion weighting. An advantage of this embodiment is that, due to the choice of different diffusion weightings, the diffusion-weighted image data can be determined particularly accurately. The embodiment variant of the method according to the invention enables particularly large diffusion weightings to be used, and consequently particularly accurate ADC maps to be determined.

In another embodiment of the method, the second k-space matrix is smaller than the first k-space matrix. Accordingly, the second k-space matrix is preferably filled with raw data at fewer positions of k-space than the first k-space matrix. Accordingly, the encoding module for acquiring the first raw data preferably acquires more raw data, i.e. samples more positions in k-space, than the encoding module for acquiring the second raw data. The volume of the first raw data is preferably greater than the volume of the second raw data. If the first raw data were to be reconstructed into image data, the latter would preferably have a higher resolution than the second raw data reconstructed into image data.

The duration of the raw data acquisition typically correlates with the volume of raw data that is to be acquired. Accordingly, the second raw data is preferably acquired faster than the first raw data. An acquisition scheme typically determines the k-space matrix and the chronological order according to which the k-space matrix is filled, in other words the chronological order of the acquisition of the raw data. Typically, the acquisition scheme can be determined by the choice of an encoding module comprised by the MR sequence.

If the second diffusion weighting is stronger than the first diffusion weighting, the time required for the application of the second diffusion gradients can be greater than the time required for the application of the first diffusion gradients. In order to keep the period of time that elapses between RF pulses and/or the echo time for the first raw data and the second raw data constant, different acquisition schemes can be chosen for different diffusion weightings. In particular, a smaller second k-space matrix can be chosen in the case of a stronger second diffusion weighting. The acquisition scheme of the second raw data is then preferably chosen so that the timing of the RF pulses comprised by the first MR sequence is kept constant.

An advantage of this embodiment of the method according to the invention is that a longer period of time that may be necessary for the application of the diffusion gradient can be offset by a shorter period of time for the acquisition of the raw data. The timing between the RF pulses, which in particular influences the intensity of the MR signals, can be maintained by the adjustment of the k-space matrices. Accordingly, the acquired raw data preferably has the same contrast. The method allows the use of particularly high diffusion weightings, wherein the size of the k-space matrix and therefore in particular the resolution of the image data to be reconstructed from the raw data serve as parameters. The differences between the raw data and/or the image data to be reconstructed from the raw data on account of the different k-space matrices can be evened out with the aid of further method steps.

A k-space matrix can be filled to different densities with raw data in different directions of k-space. In particular, the distances between positions of the k-space matrix may vary in different directions of k-space. If phase encoding and frequency encoding are used for spatial encoding, then the phase encoding typically lasts longer than the frequency encoding during acquisition of the raw data.

In order to reduce the duration of the acquisition of the second raw data owing to a stronger and if necessary longer second diffusion weighting, it may be efficient in particular to reduce the phase encoding of the second k-space matrix in comparison with the first k-space matrix. The second k-space matrix is preferably smaller in the phase encoding direction than the first k-space matrix. In the frequency encoding direction, the second k-space matrix may be chosen to be equal in size to or larger than the first k-space matrix. This enables the second raw data reconstructed into image data to have a lower resolution in the phase encoding direction, and the same resolution as or a higher resolution than the first raw data reconstructed into image data in the frequency encoding direction. In particular, the extension of the k-space matrix in the frequency encoding direction and/or the sampling time provided according to the acquisition scheme, in particular the bandwidth used for the frequency encoding, can be used in the frequency encoding direction to vary the signal-to-noise ratio.

If the second k-space matrix is smaller than the first k-space matrix, then in a segmented imaging procedure, such as is common practice for example in the case of echo-planar MR sequences, the second raw data may be acquired with a smaller number of segments if necessary. The measurement time can be reduced as a result and/or a number of acquisitions, which will be averaged subsequently in the workflow, can be performed in order to increase the signal-to-noise ratio. In segmented MR imaging, a higher diffusion weighting can accordingly result in a shortening of the measurement time or an increase in the signal-to-noise ratio.

In another embodiment of the method, the second k-space matrix is a subregion of the first k-space matrix. Accordingly, the second k-space matrix is preferably a subset of the first k-space matrix. In particular, the first k-space matrix and the second k-space matrix are preferably congruent in the center of k-space. Preferably, the second k-space matrix is a subset of the first k-space matrix, wherein the distances between adjacent positions of the two k-space matrices coincide. The k-space matrices preferably have the same resolution in k-space. K-space matrices chosen in this way can ensure compliance with the Nyquist criterion. Preferably, the first k-space matrix and/or the second k-space matrix are/is centered around the k-space center. This enables a good correspondence of the contrast of the image data that is to be reconstructed from the first raw data and the second raw data to be ensured.

In an advantageous embodiment variant of the method, the first raw data is acquired with a first echo time and the second raw data is acquired with the first echo time. The echo time defines the period of time that elapses between the application of the excitation pulse and the time instant at which the center of k-space is read out according to the acquisition scheme. This typically minimizes differences in contrast between the first raw data reconstructed into image data and the second raw data reconstructed into image data.

This embodiment enables a strong second diffusion weighting to be combined with a short first echo time, which first echo time is possible for the first k-space matrix only in combination with a diffusion weighting lower than the second diffusion weighting. Using short echo times is advantageous in the MR imaging of tissues with short T2* times, such as the liver, for example. Since the raw data is typically acquired by means of an echo-planar MR sequence or the MR sequence "RESOLVE", short echo times are important for a high signal-to-noise ratio. The intensity of the MR signals typically decreases with increasing echo time.

According to this embodiment, the first echo time can be chosen to be sufficiently short so that it is compatible with a first, preferably low, diffusion weighting. The compatibility of the first echo time with the preferably stronger second diffusion weighting is achieved by an adjustment, in particular a reduction in size, of the second k-space matrix in comparison with the first k-space matrix. According to this embodiment variant, the short echo time can be combined with a high diffusion weighting.

In another embodiment of the method, the second k-space matrix is adjusted in such a way that the second raw data that is to be assigned to the second k-space matrix is acquired with the second diffusion weighting and the first echo time by the magnetic resonance apparatus. The acquisition scheme of the first k-space matrix and/or of the second k-space matrix is preferably adjusted in such a way that the echo time is constant in spite of first and second diffusion weightings that are different from one another. This typically minimizes differences in contrast between the first raw data reconstructed into image data and the second raw data reconstructed into image data. This preferably limits the effects of the different k-space matrices to the resolution, which if necessary can be adjusted by means of further method steps. Particularly strong diffusion weightings can be generated as a result.

The diffusion-weighted image data determined according to this embodiment variant of the method is preferably not different from the diffusion-weighted image data conventionally determined as follows:

acquiring the first raw data with a first diffusion weighting, which first raw data is assigned to a third k-space matrix, acquiring the second raw data with a second diffusion weighting, which first raw data is assigned to the third k-space matrix, determining the diffusion-weighted image data based on the first raw data and the second raw data, wherein the third k-space matrix corresponds to the larger of the first or the second k-space matrix.

In another embodiment of the method, determining the diffusion-weighted image data has the following method steps:

identifying at least one position of the first k-space matrix, at which at least one position the second k-space matrix is empty, extending the second k-space matrix by the at least one position, extending the second raw data by the first raw data assigned to the at least one position.

According to this embodiment, the first k-space matrix and the second k-space matrix are compared and at least one position in k-space is identified at which the second k-space matrix is empty. According to the planned acquisition scheme for the second raw data, this position is not filled with complex numeric values of the second raw data. The second k-space matrix is extended, i.e. adjusted, such that the extended second k-space matrix includes this position. Since the acquisition scheme typically provides no second raw data for this position, the second k-space matrix cannot be filled completely with complex numeric values of the second raw data or second raw data. Instead, this position is preferably assigned the first raw data that are assigned to that position in the first k-space matrix. The union of sets of that raw data with the second raw data is designated as extended raw data. This embodiment of the method corresponds to a k-space-based combination of the raw data in the case of different k-space matrices, i.e. different occupancies of k-space for different raw data.

Preferably, the second k-space matrix is smaller than the first k-space matrix. Preferably, all positions of the first k-space matrix at which the second k-space matrix is empty are identified. If the second k-space matrix is a subset of the first k-space matrix, then the extended second k-space matrix preferably corresponds to the first k-space matrix. The set of extended raw data preferably corresponds to the set of first raw data. If each of these is reconstructed into image data, they typically have the same resolution.

Preferably, the second k-space matrix is a section of the center of the first k-space matrix. This enables the contrast-determining central second raw data to be acquired using the second diffusion weighting. The subregion of the first k-space matrix by which the second k-space matrix is extended preferably corresponds to the outer region of the first k-space matrix, which typically determines the resolution. The diffusion weighting typically influences primarily the signal intensity, and consequently the contrast of the image data that is to be reconstructed.

Preferably, the second diffusion weighting is greater than the first diffusion weighting. The second diffusion weighting is preferably strong to such an extent that the magnetic resonance device is not embodied to acquire raw data having the second diffusion weighting for the first k-space matrix. This can be made possible with the aid of this embodiment of the method according to the invention. According to this embodiment of the method of the invention, the contrast-determining raw data having a high diffusion weighting can be combined with resolution-determining raw data having a different diffusion weighting. Accordingly, the determining characteristics for diffusion-weighted image data are preferably contained in the extended raw data and in the first raw data. Based on the first raw data and the extended raw data, diffusion-weighted image data can be generated analogously to conventional methods.

The input parameters for this determination are typically the first raw data, the extended raw data, the first diffusion weighting and the second diffusion weighting. The further determination of the diffusion-weighted image data can be that the first raw data are reconstructed into first image data and the extended raw data are reconstructed into second image data, wherein the first image data and the second image data have the same resolution. An ADC map can be determined analogously to formula 1, for example.

With this embodiment of the method, both highly resolved diffusion-weighted image data can be generated and high diffusion weightings can be measured experimentally. In particular, this enables very accurate ADC maps to be generated. The k-space-based completion of missing raw data is particularly time-saving.

In another embodiment of the method, the determination of the diffusion-weighted image data has the following method steps:
  reconstructing the first raw data into first image data at a first resolution,
  reconstructing the second raw data into second image data,
  interpolating the second image data to produce interpolated second image data, such that the interpolated second image data has the first resolution,
  determining the diffusion-weighted image data based on the first image data and the interpolated second image data.

Compared to the preceding embodiment, this approach pursues an image-based combination of the differently diffusion-weighted data. The resolution of raw data reconstructed into image data is typically determined by the k-space matrix, which is filled by the raw data. Accordingly, the second image data typically have a resolution that is different from the first resolution. If the second k-space matrix is a subset of the first k-space matrix at the same k-space resolution, then the second resolution of the second image data is lower than the first resolution. The resolution of the second image data can be matched to the resolution of the first image data by interpolation, for example. In this case the pixel size is typically changed taking into account the signal distribution in neighboring pixels. This is typically accomplished iteratively. If the interpolated second image data and the first image data have an identical resolution, diffusion-weighted image data can be generated based thereon in accordance with conventional methods. The diffusion-weighted image data typically has the resolution of the input image data, i.e. the first resolution. The input parameters for this determination are typically the first diffusion weighting, or the first b-value, the second diffusion weighting, or the second b-value, the first image data and the interpolated second image data. A second k-space matrix differing from the first k-space matrix is typically no longer recognizable from these input parameters. Rather, both highly resolved diffusion-weighted image data can be generated and high diffusion weightings measured experimentally with the aid of this embodiment variant of the method. Very accurate ADC maps can be generated as a result. The image-based interpolation is particularly time-saving.

In another embodiment of the method, third image data are generated with a third diffusion weighting in a further method step based on the diffusion-weighted image data. According to equation 1, an ADC map can be used for example for calculating, in particular extrapolating, diffusion-weighted image data for further b-values. The method according to the invention enables raw data to be acquired with a particularly high diffusion weighting. In order to generate an ADC map, it is possible, according to the inventive method, to draw upon strongly diffusion-weighted data having a very high diffusion weighting and to combine said data with further, more weakly diffusion-weighted data. Accordingly, a particularly wide range of b-values can be used for the generation of an ADC map. A high level of accuracy of the ADC map can be achieved, in particular in the region of the acquired diffusion weightings, in particular for strong diffusion weightings. Image data having at least one further diffusion weighting can be calculated according to equation 1 and from diffusion-weighted image data generated according to the inventive method. The image data having at least one further diffusion weighting can be displayed to a user of the magnetic resonance device. This method can be especially accurate in particular for determining image data having a further high diffusion weighting.

The invention further concerns a magnetic resonance apparatus having a control computer configured to carry out the inventive method for determining diffusion-weighted image data. For this purpose, the control computer typically has an application processor, a determination processor, an input interface and an output interface.

The application processor is configured to apply an MR sequence to an MR scanner for an acquisition of first raw data. The application processor is also configured to apply an MR sequence to the scanner for an acquisition of second raw data. The raw data and, where appropriate, an algorithm for performing the method according to the invention can be provided to the control computer via the input interface. Further functions, algorithms or parameters required in the method can be provided to the control computer and/or the determination processor via the input interface.

The determination processor is configured to determine diffusion-weighted image data based on the first raw data and the second raw data.

Preferably, the determination is carried out by algorithms that are executable in the determination processor. The characteristics and/or further results of an embodiment of the method according to the invention, such as the diffusion-weighted image data, for example, can be provided via the output interface. The control computer and/or the determination processor can be integrated in the magnetic resonance apparatus. The control computer and/or the determination processor can also be installed separately from the magnetic resonance apparatus. The control computer and/or the determination processor can be connected to the magnetic resonance apparatus.

Embodiments of the inventive magnetic resonance apparatus correspond to the embodiments of the inventive method described above. The magnetic resonance apparatus may have further control components that are necessary and/or advantageous for performing an inventive method. The magnetic resonance apparatus may also be configured to send control signals and/or to receive and/or process control signals in order to perform an inventive method. The determination processor is preferably part of the control computer of the inventive magnetic resonance apparatus. Computer programs and other software with which the control computer automatically controls and/or performs the method workflow of the inventive method may be stored in a memory of the control computer.

The present invention also encompasses a non-transitory, computer-readable data storage medium encoded with programming instructions that, when the storage medium is loaded into a control computer or computer system of a magnetic resonance apparatus, cause the control computer or computer system to operate the magnetic resonance apparatus in order to implement any or all of the embodiments of the inventive method, as described above.

Examples of electronically readable data storage medium are a DVD, a magnetic tape or a USB stick, on which electronically readable control information, in particular software, is stored.

The advantages of the inventive magnetic resonance apparatus and the inventive computer-readable data medium substantially correspond to the advantages of the inventive method for determining a characteristic of an organ, which have been explained in detail above. Features, advantages and alternative embodiments cited in connection with the method apply equally to the other aspects of the invention.

DESCRIPTION OF THE PREFERRED EMBODIMENTS

Figure 1:
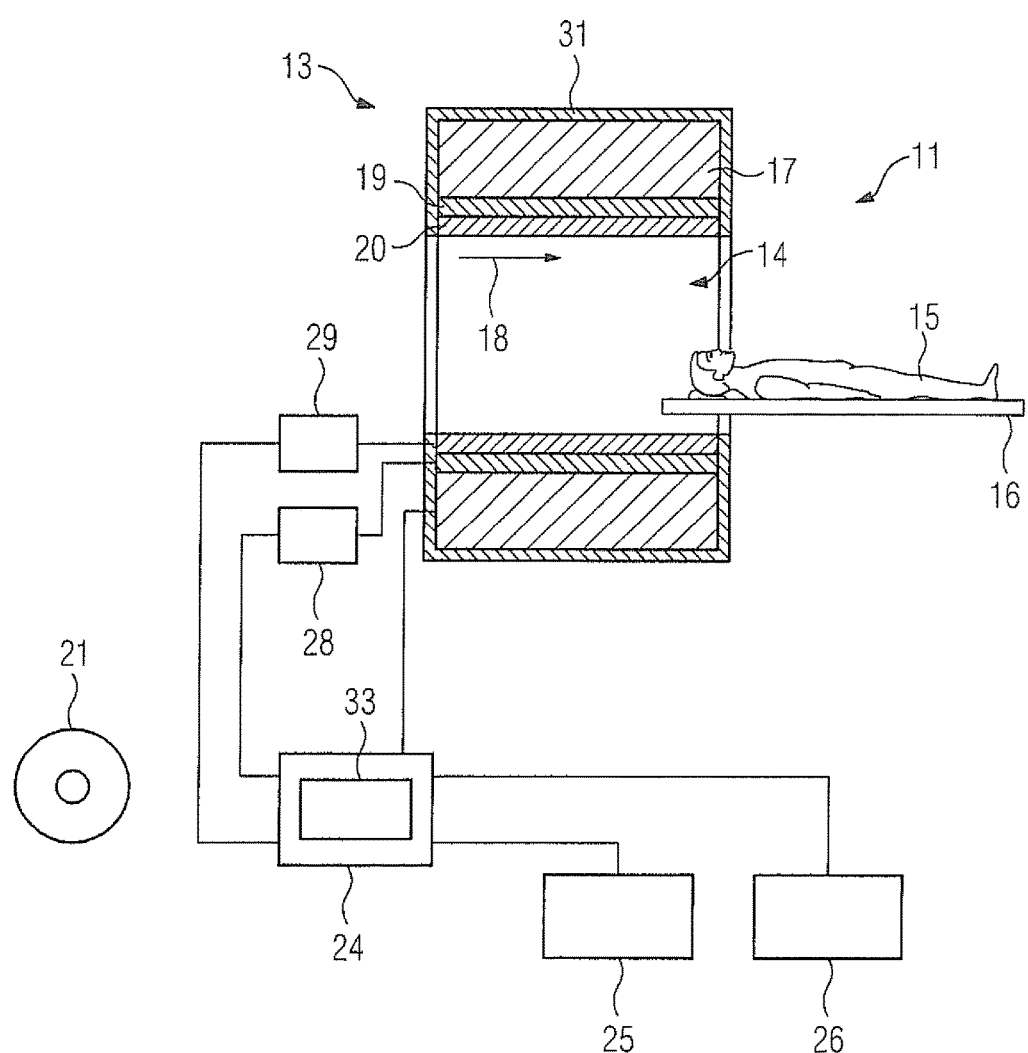
FIG. 1 schematically illustrates a magnetic resonance apparatus according to the invention.

FIG. 1 schematically illustrates an inventive magnetic resonance (MR) apparatus 11 for performing the inventive method. The magnetic resonance apparatus 11 has an MR data acquisition scanner 13 that has a basic field magnet 17 for generating a strong and constant basic magnetic field 18.

In addition, the scanner 13 has a cylinder-shaped patient receiving zone 14 for accommodating a patient 15. The patient receiving zone 14 is cylindrically enclosed by the scanner 13 in a circumferential direction. The patient 15 can be introduced into the patient receiving zone 14 by a patient support and positioner 16. For this purpose, the patient support and positioner 16 has a patient table that is movable inside the scanner 13. The scanner 13 is shielded externally by a housing cladding 31.

The scanner 13 additionally has a gradient coil arrangement 19 used to spatial encode MR signals during an imaging session. The gradient coil arrangement 19 is actuated by a gradient controller 28. The scanner 13 furthermore has a radio-frequency (RF) antenna 20, which is shown as a bodycoil permanently integrated in the scanner 13, and a radio-frequency antenna controller 29. The radio-frequency antenna 20 is actuated by the radio-frequency antenna controller 29 so as to radiate radio-frequency pulses into an examination chamber that is substantially formed by the patient receiving zone 14, the radiated radio-frequency pulses give nuclear spins of certain atoms in the patient 15 a magnetization that deflects those nuclear spins by a so-called flip angle from the direction of the basic magnetic field 18. As these excited nuclear spins return to the steady state, they emit the aforementioned magnetic resonance signals, which are detected by the radio-frequency antenna 20, or another reception antenna in the scanner 13.

The magnetic resonance apparatus 11 has a control computer 24 that controls the basic field magnet 17, the gradient controller 28 and the radio-frequency antenna controller 29. The control computer 24 is responsible for the centralized control of the magnetic resonance apparatus 11, such as for performing MR sequences. Control information such as imaging parameters, as well as reconstructed image data, can be displayed for a user on a display unit 25, for example on at least one monitor, of the magnetic resonance apparatus 11. The magnetic resonance apparatus 11 additionally has an input unit 26 via which information and/or imaging parameters can be entered by a user during a measurement procedure. The control computer 24 can include the gradient controller 28 and/or the radio-frequency antenna controller 29 and/or the display unit 25 and/or the input unit 26. The control computer 24 further includes a determination processor 33. The magnetic resonance apparatus 11 is thus configured together with the determination processor 33 for performing the method according to the invention.

The illustrated magnetic resonance apparatus 11 can have further components that are ordinarily present in magnetic resonance apparatuses. The general principle of operation of a magnetic resonance apparatus is known to those skilled in the art, so a detailed description of the further components and such operation is not necessary herein.

The method as described herein may be present in the form of a computer program code that implements the method in the control computer 24 when the code is executed in the control computer 24. A computer-readable data storage medium 21 having electronically readable control information stored is provided for lading into the control computer 24.

Figure 2:
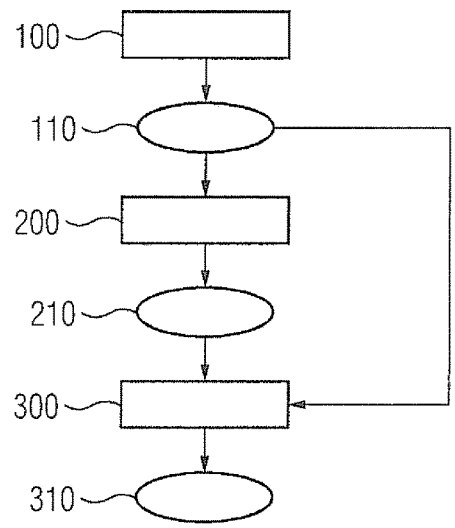
FIG. 2 is a flowchart of a first embodiment of the method according to the invention.

FIG. 2 shows a flowchart of a first embodiment of the inventive method for determining diffusion-weighted image data by means of a magnetic resonance apparatus 11. The method according to the invention commences with method step 100, wherein first raw data 110 are acquired with a first diffusion weighting 51 and assigned to a first k-space matrix 41. In method step 200, second raw data 210 are acquired with a second diffusion weighting 52, which second raw data 210 are assigned to a second k-space matrix 42. The first k-space matrix 41 and the second k-space matrix 42 are different from one another at at least one position. In method step 300, the diffusion-weighted image data 310 is determined based on the first raw data 110 and the second raw data 210. In this process, the first raw data 110 and the second raw data 210 are typically used for determining the diffusion-weighted image data 310.

Figure 3:
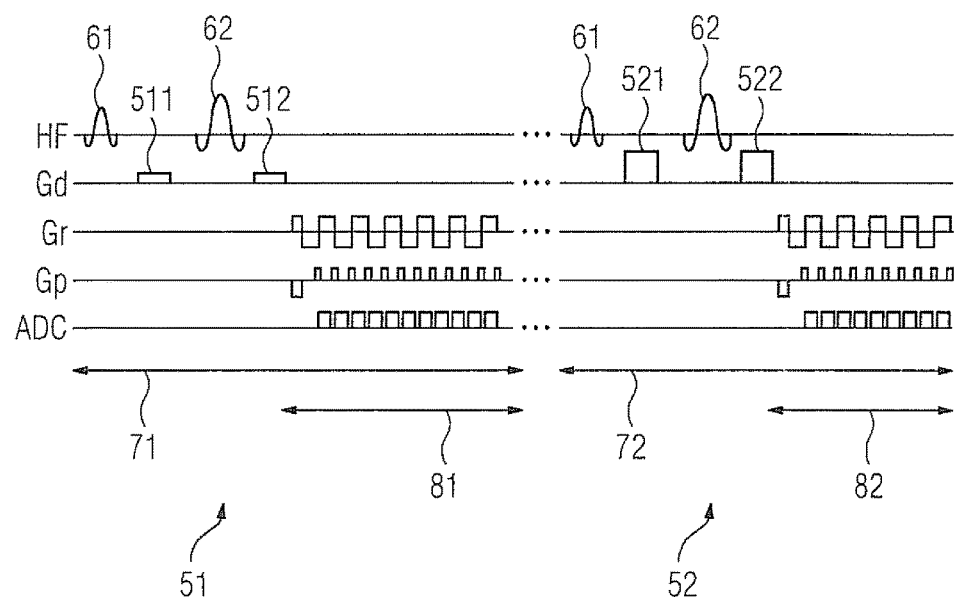
FIG. 3 shows a diagram of a diffusion sequence.

FIG. 3 shows a diagram of a diffusion sequence that is designed to acquire diffusion-weighted MR signals. The diagram represents two sections of the diffusion sequence, wherein the first section 71 generates a first diffusion weighting 51 and the second section 72 generates a second diffusion weighting 52. The horizontal axis in this case describes a time characteristic. The amplitudes of the radio-frequency pulses (RF) and the magnetic field gradients (Gd, Gp, Gr) are plotted on the vertical axis. The time characteristic of the readout windows (ADC) is indicated in addition. The magnetic field gradients Gp and Gr are used for spatial encoding, wherein in particular Gp is used for phase encoding and Gr for frequency encoding. Gd denotes the amplitude of the diffusion gradients.

The first section 71 is preferably structured as follows: The radio-frequency pulse 61 is typically an excitation pulse and generates a flip angle of approximately 90°. Next, the first dephasing diffusion gradient 511 is applied, causing a first dephasing. This is followed by a further radio-frequency pulse 62 for refocusing and a first rephasing diffusion gradient 512, which neutralizes the first dephasing in the static case by rephasing. The diffusion gradients 511 and 512 generate a first diffusion weighting 51. There follows a first readout module 81, that includes a sequence of a number of magnetic field gradients for phase encoding Gp and magnetic field gradients for frequency encoding Gr and corresponding ADC readout windows. The first section 71 can be applied with varying readout modules 81 in succession and optionally be interleaved with a further section, for example the second section.

The second section 72 follows. The second section 72 preferably has the radio-frequency pulses 61 and 62, analogously to the first section 71. The second section 72 includes the second readout module 82, which is preferably different from the first readout module 81. For example, compared to the first readout module 81, the second readout module 82 has fewer magnetic field gradients Gp for phase encoding and/or fewer ADC readout windows. As a result, the second section 72 and/or the second readout module 82 can be shorter than the first section 71 and/or the first readout module 71.

Except for the readout modules 81 and 82, the two sections 71 and 72 preferably have the same timing. In particular, the echo time of the two sections 71, 72 is preferably identical. The period of time that elapses between the RF pulse 61 of the first section 71 and the time instant of the first readout module 81 at which the center of k-space 40 is read out preferably corresponds to the period of time that elapses between the RF pulse 61 of the second section 72 and the time instant of the second readout module 82 at which the center of k-space 40 is read out. The two sections 71 and 72 are preferably different in the diffusion gradients 511, 512, 521, 522 and the diffusion weighting 51, 52 resulting therefrom. The diffusion gradients 521 and 522 in section 72 generate a second diffusion weighting 52. The second diffusion weighting 52 is preferably stronger than the first diffusion weighting 51. The two sections 71 and 72 can be applied within the scope of one MR sequence. An MR sequence includes the two sections 71 and 72.

Figure 4:
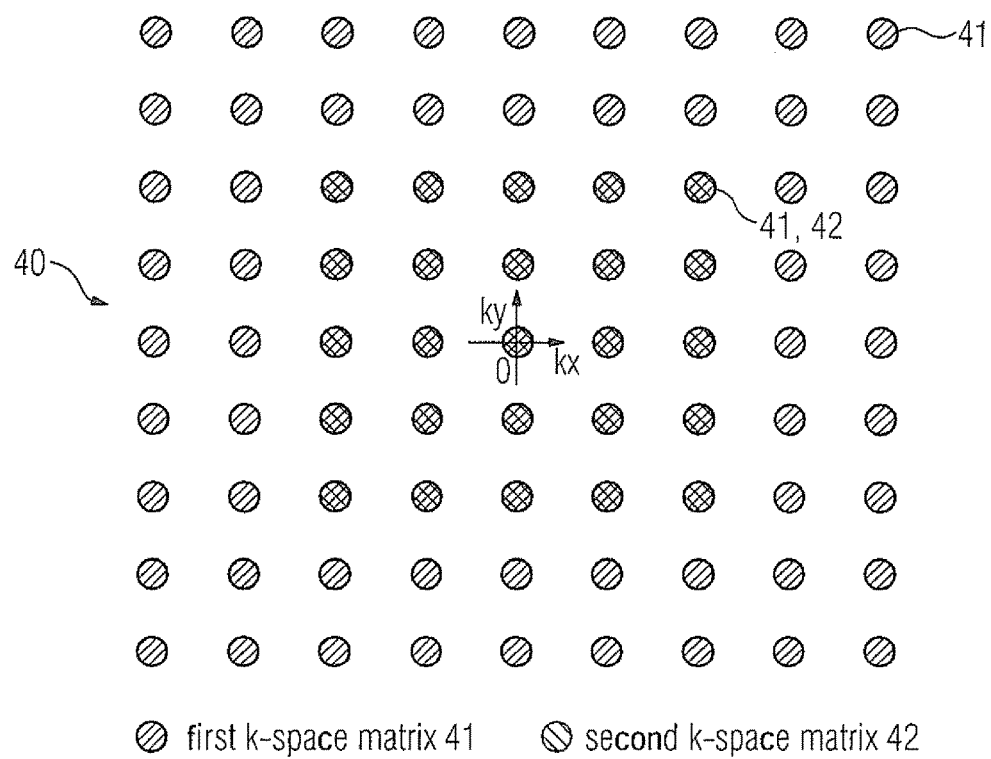
FIG. 4 illustrates k-space for explaining the invention.

FIG. 4 shows k-space 40 having two k-space matrices 41, 42. Only one section of k-space 40 is considered. The extension of k-space 40 in the vertical direction ky and in the horizontal direction kx is in principle unlimited. Hatched circles indicate the area of k-space 40 that is occupied by the first k-space matrix 41. A subregion of the first k-space matrix 41 is also occupied by the second k-space matrix 42. The second k-space matrix 42 is in this case smaller than the first k-space matrix 41.

Figure 5:
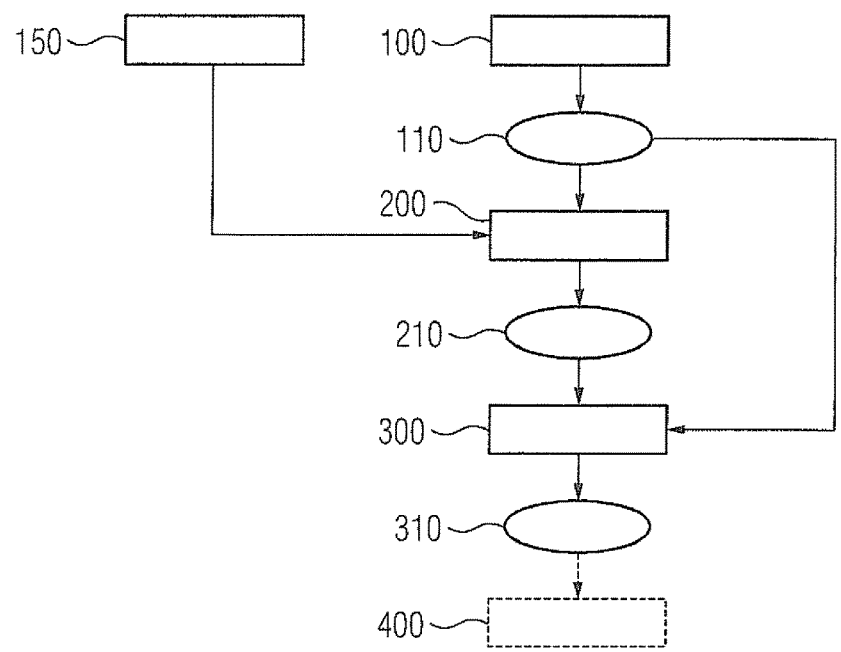
FIG. 5 is a flowchart of a second embodiment of the method according to the invention.

FIG. 5 shows a flowchart of a second embodiment of the method according to the invention. In this case, in method step 100, first raw data 110 are acquired with the first diffusion weighting 51 and the first echo time. In addition to the method illustrated in FIG. 2, the second k-space matrix 42 is adjusted in method step 150 such that the acquisition 200 of the second raw data 210, which are to be assigned to the second k-space matrix 42 with the second diffusion weighting 52 and the first echo time can be performed by the scanner 13. The acquisition 200 of the second raw data 210 that are to be assigned to the second k-space matrix 42 is preferably carried out using the first echo time. In method step 300, the diffusion-weighted image data 310 is determined based on the first raw data 110 and the second raw data 210. Optionally, in a further method step 400, third image data can be generated with a third diffusion weighting based on the diffusion-weighted image data 310. Typically, this is accomplished by a calculation and/or without further application of an MR sequence or a section of an MR sequence.

Figure 6:
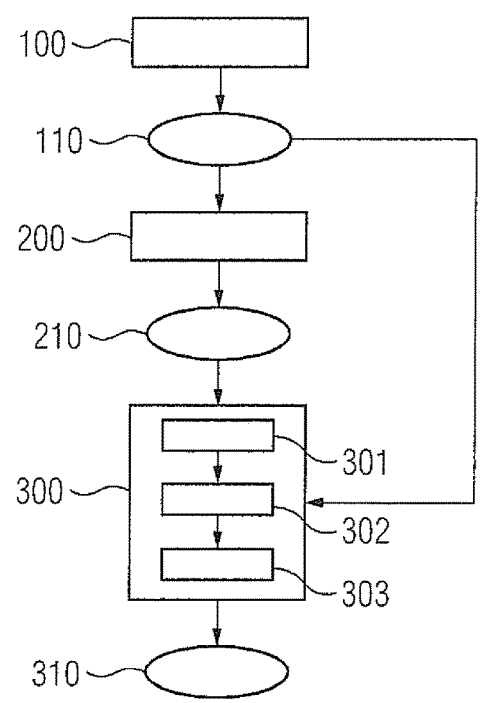
FIG. 6 is a flowchart of a third embodiment of the method according to the invention.

FIG. 6 shows a flowchart of a third embodiment of the method according to the invention. Method steps 100 and 200 correspond to the previously described method implementations. In this embodiment, in method step 300, the determination of the diffusion-weighted image data 310 preferably includes the following further method steps. In method step 301, at least one position of the first k-space matrix 41 is identified, at which at least one position the second k-space matrix 42 is empty. According to FIG. 4, this corresponds to a circle hatched in one direction only. The difference of sets of the first k-space matrix 41 and the second k-space matrix 42 is preferably determined.

In method step 302, the second k-space matrix 42 is preferably extended by the at least one position. In method step 303, the second raw data 210 is preferably extended by the first raw data assigned to the at least one position. According to this embodiment variant, in particular the first k-space matrix 41 and the second k-space matrix 42 can be brought into registration. In further method steps that include method step 300, the first raw data 41 is reconstructed into first image data, and the second raw data 42 is reconstructed into second image data, which has a similar, preferably the same, spatial resolution. The diffusion-weighted image data 310 is determined based on the first image data and the second image data. In this case a conventional method can be used for determining diffusion-weighted image data using two sets of image data which differ only in terms of their diffusion weighting.

Figure 7:
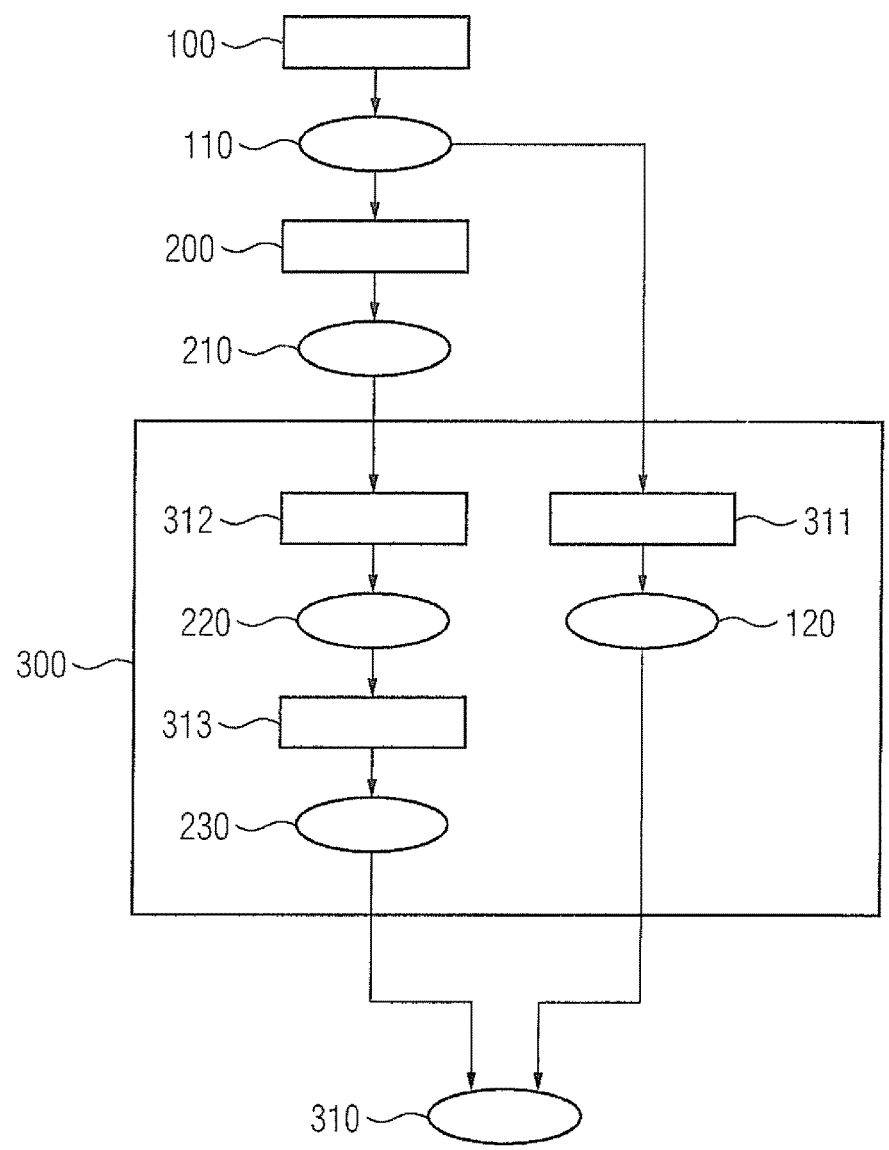
FIG. 7 is a flowchart of a fourth embodiment of the method according to the invention.

FIG. 7 shows a flowchart of a fourth embodiment of the method according to the invention. Method steps 100 and 200 correspond to the previously described method implementations. In this embodiment, method step 300, wherein the determination of the diffusion-weighted image data 310 takes place, includes the following further method steps. In method step 311, the first raw data 110 are reconstructed into first image data 120 at a first resolution. In method step 312, the second raw data 210 are reconstructed into second image data 220 at a second resolution. Typically, the first resolution is different from the second resolution, since the first k-space matrix 41 and the second k-space matrix 42 are different from one another at at least one position of k-space 40. Preferably, the second k-space matrix 42 is smaller than the first k-space matrix 41, such that the second resolution is lower than the first resolution. In method step 313, the second image data 220 are interpolated to produce interpolated second image data 230, such that the interpolated second image data 230 have the first resolution. The diffusion-weighted image data 310 are then determined based on the first image data 120 and the interpolated second image data 230.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for determining diffusion-weighted image data by magnetic resonance (MR) imaging, said method comprising:
    operating an MR data acquisition scanner to acquire first raw MR data with a first diffusion weighting, and entering said first raw MR data into an electronic memory organized with a first k-space matrix therein;
    operating said MR data acquisition scanner to acquire second raw MR data with a second diffusion weighting, and entering said second raw MR data into a second k-space matrix organized in said electronic memory, said first k-space matrix and said second k-space matrix being different from each other at at least one position therein;
    from a processor, accessing said electronic memory and determining diffusion-weighted image data from said first raw data in said first k-space matrix and said second raw data in said second k-space matrix; and
    from said processor, making the determined diffusion-weighted image data available in electronic form, as a data file.

2. A method as claimed in claim 1 comprising operating said MR data acquisition scanner to acquire said second raw MR data with said second diffusion weighting being stranger than said first diffusion weighting.

3. A method as claimed in claim 1 comprising organizing said electronic memory so that said second k-space matrix is smaller than said first k-space matrix.

4. A method as claimed in claim 1 comprising organizing said electronic memory so that said second k-space matrix is a sub-region of said first k-space matrix.

5. A method as claimed in claim 1 comprising operating said MR data acquisition scanner to acquire said first raw MR data with a first echo time, and to also acquire said second raw MR data with said first echo time.

6. A method as claimed in claim 5 comprising organizing said electronic memory so that said second k-space matrix is adjusted so that said second raw MR data are entered into said second k-space matrix with said second diffusion weighting and said first echo time.

7. A method as claimed in claim 1 comprising, in said processor, determining said diffusion-weighted image data by:
    identifying at least one position of said first k-space matrix for which a corresponding position in said second k-space matrix is empty;
    extending said second k-space matrix by said at least one position; and
    extending said second raw MR data by said first raw MR data entered in said first k-space matrix at said at least one position.

8. A method as claimed in claim 1 comprising, in said processor, determining said diffusion-weighted image data by:
    reconstructing said first raw MR data into first MR image data with a first resolution;
    reconstructing said second raw MR data into second MR image data;
    interpolating said second MR image data in order to produce interpolated second MR image data so that said interpolated second MR image data has said first resolution; and
    determining said diffusion-weighted image data from said first MR image data and the interpolated second MR image data.

9. A method as claimed in claim 1 comprising, in said processor, generating image data with a third diffusion weighting based on said determined diffusion-weighted image data.

10. A magnetic resonance (MR) apparatus comprising:
    an MR data acquisition scanner;
    an electronic memory;
    a computer configured to operate said MR data acquisition scanner to acquire first raw MR data with a first diffusion weighting, and to enter said first raw MR data into said electronic memory organized with a first k-space matrix therein;
    said computer being configured to operate said MR data acquisition scanner to acquire second raw MR data with a second diffusion weighting, and to enter said second raw MR data into a second k-space matrix organized in said electronic memory, said first k-space matrix and said second k-space matrix being different from each other at at least one position therein;
    a processor configured to access said electronic memory and to determine diffusion-weighted image data from said first raw data in said first k-space matrix and said second raw data in said second k-space matrix; and
    said processor being configured to make the determined diffusion-weighted image data available in electronic form, as a data file.

11. A non-transitory, computer-readable data storage medium encoded with programming instructions, said storage medium being loaded into a computer system of a magnetic resonance (MR) apparatus comprising an MR data acquisition scanner, and said programming instructions causing said computer system to:
    operate the MR data acquisition scanner to acquire first raw MR data with a first diffusion weighting, and enter said first raw MR data into an electronic memory organized with a first k-space matrix therein;
    operate said MR data acquisition scanner to acquire second raw MR data with a second diffusion weighting, and enter said second raw MR data into a second k-space matrix organized in said electronic memory, said first k-space matrix and said second k-space matrix being different from each other at at least one position therein;
    determine diffusion-weighted image data from said first raw data in said first k-space matrix and said second raw data in said second k-space matrix; and
    make the determined diffusion-weighted image data available in electronic form, as a data file.

* * * * *